(12) United States Patent  
Ogawa et al.

(10) Patent No.: US 6,293,746 B1
(45) Date of Patent: Sep. 25, 2001

(54) TRANSFER ROBOT

(75) Inventors: Hironori Ogawa, Osaka; Masashi Kamitani, Ibaraki, both of (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 09/348,226

(22) Filed: Jul. 6, 1999

(30) Foreign Application Priority Data

Jul. 25, 1998 (JP) .................................................. 10-225327

(51) Int. Cl.$^7$ ...................................................... B65H 1/00
(52) U.S. Cl. ........................ 414/223; 414/744.4; 414/805; 414/941
(58) Field of Search .................................... 414/939, 941, 414/744.5, 744.4, 744.6, 217, 222, 805, 223

(56) References Cited

U.S. PATENT DOCUMENTS

| | | | |
|---|---|---|---|
| 4,666,366 | * | 5/1987 | Davis ..................... 414/749 |
| 4,909,701 | * | 3/1990 | Hardegen et al. .................... 414/749 |
| 4,951,601 | * | 8/1990 | Mayden et al. ....................... 118/719 |
| 5,083,896 | | 1/1992 | Uehara et al. . |
| 5,151,008 | * | 9/1992 | Ishida et al. ....................... 414/744.5 |
| 5,180,276 | * | 1/1993 | Hendrickson ....................... 414/752 |
| 5,227,708 | * | 7/1993 | Lowrance ..................... 414/222 |
| 5,333,986 | | 8/1994 | Mizukami et al. . |
| 5,344,542 | * | 9/1994 | Maher et al. ........................ 414/217 |
| 5,421,695 | | 6/1995 | Kimura . |
| 5,439,547 | | 8/1995 | Kumagai . |
| 5,447,409 | * | 9/1995 | Grunes et al. .................... 414/744.6 |
| 5,584,647 | * | 12/1996 | Uehara et al. ..................... 414/744.5 |
| 5,636,963 | | 6/1997 | Haraguchi et al. . |
| 5,647,724 | * | 7/1997 | Davis, Jr. et al. ................ 414/744.5 |
| 5,667,354 | | 9/1997 | Nakazawa . |
| 5,713,717 | | 2/1998 | Cho . |
| 5,725,352 | | 3/1998 | Tanaka . |
| 5,765,444 | | 6/1998 | Bacchi et al. . |
| 5,789,878 | * | 8/1998 | Krocker et al. ....................... 414/222 |
| 5,813,823 | | 9/1998 | Hofmeister . |
| 5,857,826 | * | 6/1999 | Sato et al. ......................... 414/744.6 |
| 5,950,495 | * | 9/1999 | Ogawa et al. ..................... 414/744.5 |
| 5,975,834 | * | 11/1999 | Ogawa et al. ..................... 414/744.5 |
| 6,048,162 | * | 4/2000 | Moslehi ............................ 414/744.6 |
| 6,057,662 | * | 5/2000 | McAndrew et al. ............... 414/744.5 |
| 6,102,649 | * | 8/2000 | Ogawa et al. ..................... 414/744.5 |
| 6,109,860 | * | 8/2000 | Ogawa et al. ..................... 414/744.5 |

* cited by examiner

Primary Examiner—Joseph A. Fischetti
(74) Attorney, Agent, or Firm—Merchant & Gould P.C.

(57) ABSTRACT

A transfer robot is provided which includes a stationary base, two coaxially rotatable shafts, two motors for driving these shafts, and an arm mechanism provided with at least one handling member for holding a workpiece. The arm mechanism includes a base link rotatable about a first axis, and a pantograph assembly carried by the base link. The pantograph assembly is made up of an outer link supported by the base link for rotation about a second axis, intermediate links supported by the outer link for rotation about third axes, an inner link supported by the intermediate links for rotation about fourth axes. The third axes are offset from the second axis toward the first axis. The distance between the first and the second axes is equal to the distance between the third and the fourth axes.

5 Claims, 16 Drawing Sheets

TRANSFER ROBOT

BACKGROUND OF THE INVENTION

1. Field of the Invention

The present invention relates to a transfer robot used for semiconductor manufacturing equipment, liquid crystal display processing equipment and the like. More particularly, the present invention relates to a transfer robot for transferring workpieces between processing chambers under a vacuum.

2. Description of the Related Art

Conventionally, use has been made of various kinds of transfer robots designed for semiconductor manufacturing equipment, liquid crystal display processing equipment and the like. FIGS. 15–17 of the accompanying drawings illustrate an example of conventional transfer robot.

As shown in FIG. 17, the conventional transfer robot is provided with a handling member 84. Though not illustrated, an object to be processed (called "workpiece" hereinafter), such as a silicon wafer, is placed on the handling member 84. The handling member 84, which is carried by an arm mechanism, is arranged to move horizontally in a straight line as well as to rotate in a horizontal plane around a central axis P1. A plurality of processing chambers 71–76 for performing predetermined processing are disposed around the central axis P1. With the use of the transfer robot, the workpiece is automatically brought to and taken away from a selected one of the processing chambers 71–76.

Referring to FIG. 15, the conventional transfer robot includes a rotatable base 81 and a first arm 82. The rotatable base 81 is caused to rotate about a first axis P1 by a driving motor, while the first arm 82 is caused to rotate about the first axis P1 by another driving motor which is fixed to the rotatable base 81.

In FIG. 15, reference number 83 refers to a second arm which is rotatable about a second axis Q1 relative to the first arm 82, while reference numeral 84 refers to a handling member which is rotatable about a third axis R1 relative to the second arm 83.

Reference numeral 85 refers to a first rotation-transmitting member which is fixed to the rotatable base 81 coaxially with the first axis P1, while reference numeral 86 refers to a second rotation-transmitting member which is fixed to the second arm 83 coaxially with the second axis Q1. Reference numeral 87 refers to a third rotation-transmitting member fixed to the first arm 82 coaxially with the second axis Q1, while reference numeral 88 refers to a fourth rotation-transmitting member fixed to the handling member 84 coaxially with the third axis R1.

A first connecting member 89 is provided between the first rotation-transmitting member 85 and the second rotation-transmitting member 86. Also, a second connecting member 90 is provided between the third rotation-transmitting member 87 and the fourth rotation-transmitting member 88. The distance S between the first and second axes P1, Q1 is equal to the distance between the second and third axes Q1, R1. The radius ratio of the first rotation-transmitting member 85 to the second rotation-transmitting member 86 is 2 to 1. The radius ratio of the fourth rotation-transmitting member 88 to the third rotation-transmitting member 87 is also 2 to 1.

Chain sprockets or pulleys may be used for the first to fourth rotation-transmitting members 85–88. Correspondingly, the first and second connecting members 89, 90 may be chains or timing belts.

Reference will now be made to the operation of the arm mechanism of the conventional transfer robot.

At the outset, it is assumed that the rotatable base 81 is kept stationary, and that the first, second and third axes P1, Q1, R1 are initially located in a common straight line, as shown in FIG. 16. Starting from this state, the first arm 82 is rotated counterclockwise through an angle θ about the first axis P1.

During the above operation, the first rotation-transmitting member 85 is fixed in position, while the second axis Q1 is moved counterclockwise around the first axis P1 through the angle θ. (Thus, the second axis Q1 is shifted from the initial position to a new position Q11.) As a result, a Y1-side portion of the first connecting member 89 is wound around the first rotation-transmitting member 85, whereas a Y2-side portion of the same connecting member is unwound from the first rotation-transmitting member 85.

Thus, as shown in FIG. 16, the first connecting member 89 is moved in a direction indicated by arrows a1 and a2. As a result, the second rotation-transmitting member 86 is rotated clockwise about the second axis Q1.

As mentioned above, the radius ratio of the first rotation-transmitting member 85 to the second rotation-transmitting member 86 is 2 to 1. Thus, when the first arm 82 is rotated counterclockwise about the first axis P1 through the angle θ, the second rotation-transmitting member 86 is rotated clockwise about the second axis Q11 through an angle 2θ.

At this time, since the second rotation-transmitting member 86 is fixed to the second arm 83, the second rotation-transmitting member 86 and the second arm 83 are rotated clockwise about the second axis Q1 through an angle 2θ.

If the second arm 83 did not change its orientation relative to the first arm 82, the third axis R1 would be brought to an R11 position shown by broken lines. Actually, however, the second rotation-transmitting member 86 is rotated clockwise about the second axis Q11 through an angle 2 θ. Therefore, the third axis R11 is moved clockwise about the second axis Q11 through the same angle 2 θ to be brought to the R12 position. This means that the third axis R12 remains in the straight line extending through the first and the third axes Pl and R1 even while the first arm 82 is being rotated counterclockwise about the first axis P1 through an angle θ.

When the second arm 83 is rotated clockwise about the second axis Q11 through an angle 2 θ, thereby bringing the third axis R11 to the R12 position, a Y2-side portion of the second connecting member 90 is wound around the third rotation-transmitting member 87, whereas a Y1-side portion of the same connecting member is unwound from the third rotation-transmitting member 87.

As a result, the second connecting member 90 will be shifted in a direction b1-b2 shown in FIG. 16. Thus, the fourth rotation-transmitting member 88 is rotated counterclockwise about the third axis R12.

When the second arm 83 is rotated clockwise about the second axis Q11 through an angle 2 θ as stated above, the fourth rotation-transmitting member 88 is rotated counterclockwise about the third axis R12 through an angle θ (since the radius ratio of the fourth rotation-transmitting member 88 to the third rotation-transmitting member 87 is 2 to 1). As a result, a point C0 of the fourth rotation-transmitting member 88 is brought to a position C1 on the straight line passing through the first and the third axes P1, R12.

Upon rotation of the first arm 82 about the first axis P1 in the counterclockwise direction as described above, the handling member 84 is moved along the line passing through the first and the third axes P1, R1. During this operation, the handling member 84 does not changed its attitude or orientation since it is fixed to the fourth rotation-transmitting member 88.

The transfer robot having the above-described arrangement is installed at the center of the processing chambers 71–76, as shown in FIG. 17. Workpieces are transferred by the transfer robot between these chambers 71–76.

Though useful in many respects, the conventional transfer robot has been found disadvantageous in the following points.

First, as shown in FIG. 15, the second arm 83 incorporates the fourth rotation-transmitting member 88 and the second connecting member 90. In this arrangement, the second arm 83 is rendered to have an unduly great thickness H1.

Second, since the non-illustrated driving motor for actuating the arm mechanism is mounted on the rotatable base 81, the motor is rotated together with the base 81 around the axis P1. In the conventional transfer robot, use is made of a power supply cable for connecting the driving motor to an external power source. Thus, when the driving motor is moved around the central axis P1, the power supply cable may be wounded about a shaft. Clearly, when the cable has been wounded on the shaft too many times and yet the driving motor continues to be moved around the central axis PI, the cable may be damaged (snapped at worst).

In order to avoid such a problem, the rotation of the base 81 should be stopped before the rotation angle of the base 81 goes beyond a predetermined limit (540° forexample). However, for controlling the rotation of the rotatable base 81, additional devices such as a monitor and a rotation controlling unit may be needed. Disadvantageously, such additional devices will render the transfer robot unduly expensive. Besides, the restriction of the rotation angle of the base 81 tends to make the conventional transfer robot less usable.

SUMMARY OF THE INVENTION

It is, therefore, an object of the present invention to provide a compact, inexpensive transfer robot which is easy to operate and capable of providing good productivity.

According to a first aspect of the present invention, there is provided a transfer robot comprising:

a stationary base member;

a first shaft and a second shaft which are rotatable about a common first axis, each of the first and the second shafts being coaxially supported by the base member;

a first driving device and a second driving device associated with the first shaft and the second shaft, respectively, each of the first and the second driving devices being attached to the base member;

a base link fixed to the first shaft;

an outer link supported by the base link for rotation about a second axis;

a pair of intermediate links each supported by the outer link for rotation about a third axis which is offset from the second axis toward the first axis;

an inner link supported by each of the intermediate links for rotation about a fourth axis;

a first rotation transmitting member fixed to the second shaft;

a second rotation transmitting member fixed to the outer link, the second rotation transmitting member having an axis coinciding with the second axis;

a third rotation transmitting member fixed to the base link, the third rotation transmitting member having an axis coinciding with the second axis;

fourth rotation transmitting members fixed to the intermediate links, respectively, each of the fourth rotation transmitting members having an axis coinciding with the third axis;

a first connection member for connecting the first and the second rotation transmitting members to each other;

a second connection member for connecting the third and the fourth rotation transmitting members to each other; and a first handling member carried by the inner link for supporting a workpiece to be processed;

wherein a distance between the first axis and the second axis is equal to a distance between the third axis and the fourth axis.

According to a preferred embodiment, the transfer robot may further comprise a second handling member supported by the inner link. In such an instance, the first handling member and the second handling member may be arranged to project from the inner link in opposite directions.

Preferably, each of the first and the second shafts may be rotatably supported via a magnetic fluid seal for hermetic sealing.

According to a second aspect of the present invention, there is provided a transfer robot comprising:

a stationary base member;

a first shaft and a second shaft which are rotatable about a common first axis, each of the first and the second shafts being coaxially supported by the base member;

a first driving device and a second driving device associated with the first shaft and the second shaft, respectively, each of the first and the second driving devices being attached to the base member;

a base link fixed to the first shaft;

an outer link supported by the base link for rotation about a second axis;

a pair of intermediate links each supported by the outer link for rotation about a third axis which is offset from the second axis toward the first axis;

an inner link supported by each of the intermediate links for rotation about a fourth axis;

a first rotation transmitting member fixed to the second shaft;

a second rotation transmitting member fixed to the outer link, the second rotation transmitting member having an axis coinciding with the second axis;

a third rotation transmitting member fixed to the base link, the third rotation transmitting member having an axis coinciding with the second axis;

fourth rotation transmitting members fixed to the intermediate links, respectively, each of the fourth rotation transmitting members having an axis coinciding with the third axis;

a first connection member for connecting the first and the second rotation transmitting members to each other;

a second connection member for connecting the third and the fourth rotation transmitting members to each other; and a first handling member carried by the inner link for supporting a workpiece to be processed;

wherein the fourth axis is arranged such that a straight line which passes through the first axis and is parallel to a straight line defined by the third axes extends between the third axis and the fourth axis.

In the above arrangement, the distance between the first axis and the second axis may be equal to the distance between the third axis and the fourth axis.

Other objects, features and advantages of the present invention will become clearer from the following detailed description given with reference to the accompanying drawings.

DETAILED DESCRIPTION OF THE PREFERRED EMBODIMENTS

The preferred embodiments of the present invention will be described below with reference to the accompanying drawings.

Figure 4:
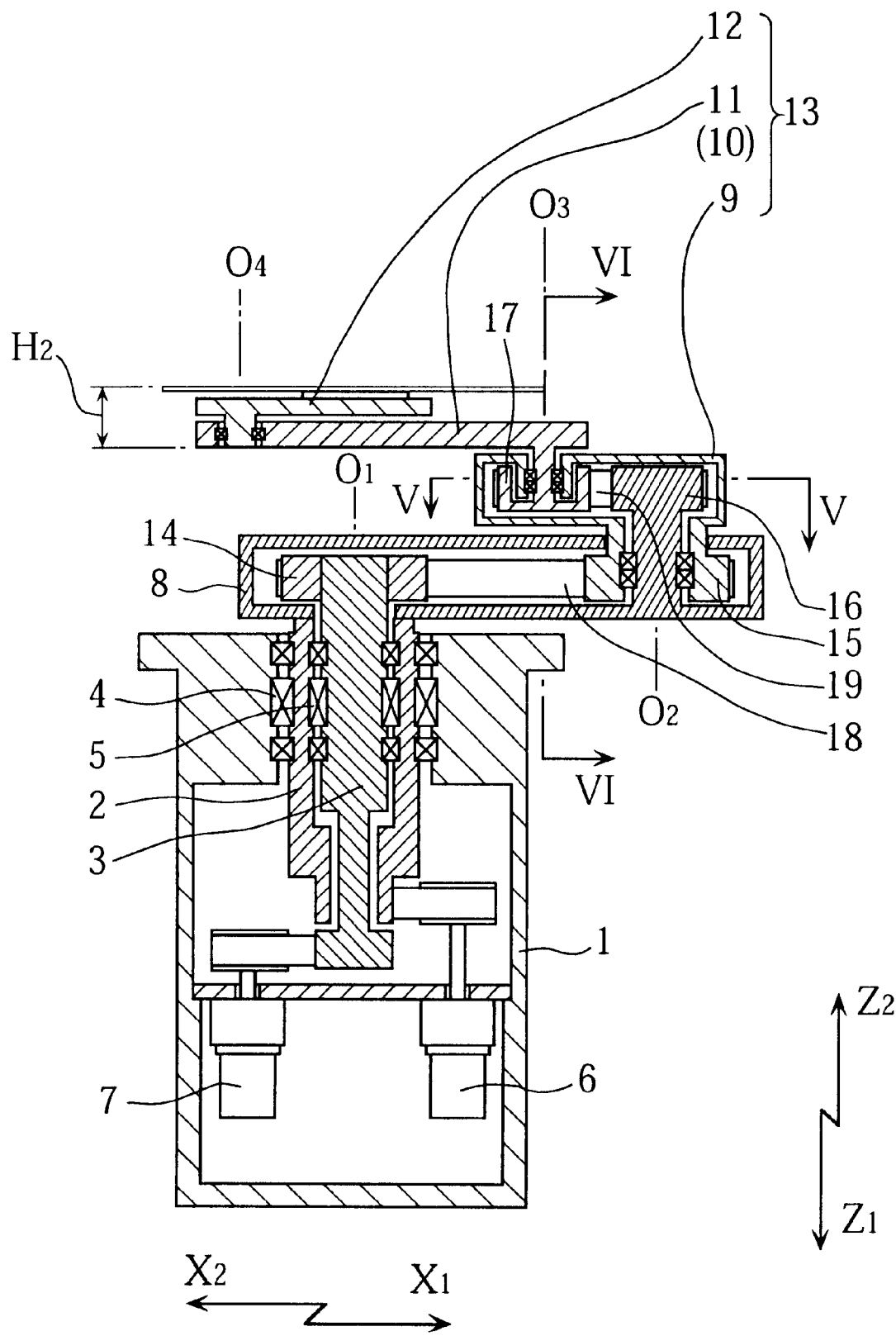
FIG. 4 is a sectional front view showing the transfer robot of the first embodiment.
Figure 5:
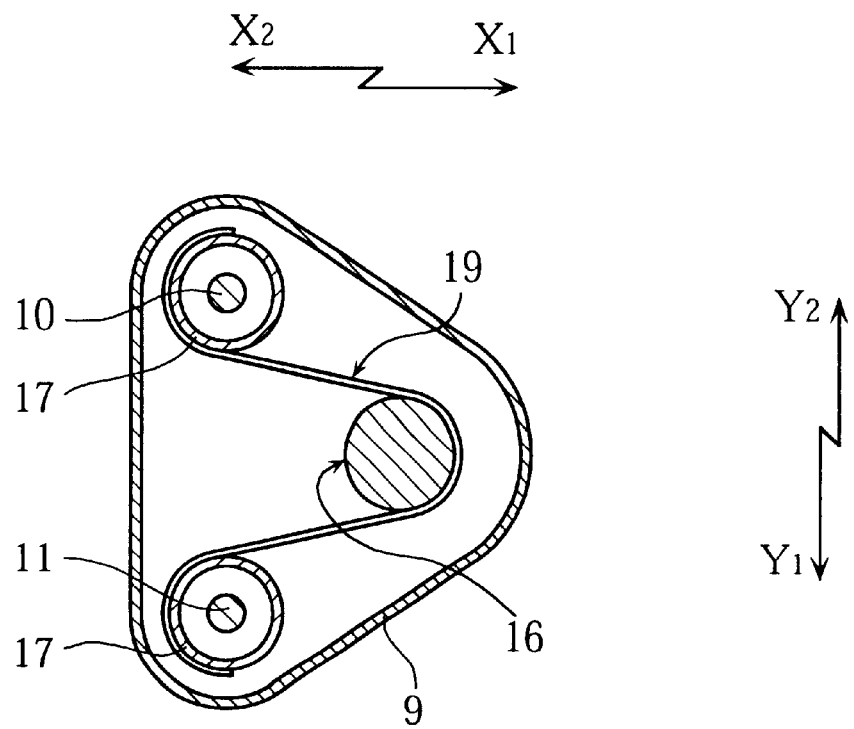
FIG. 5 is a sectional view taken along lines V—V in FIG. 4.
Figure 6:
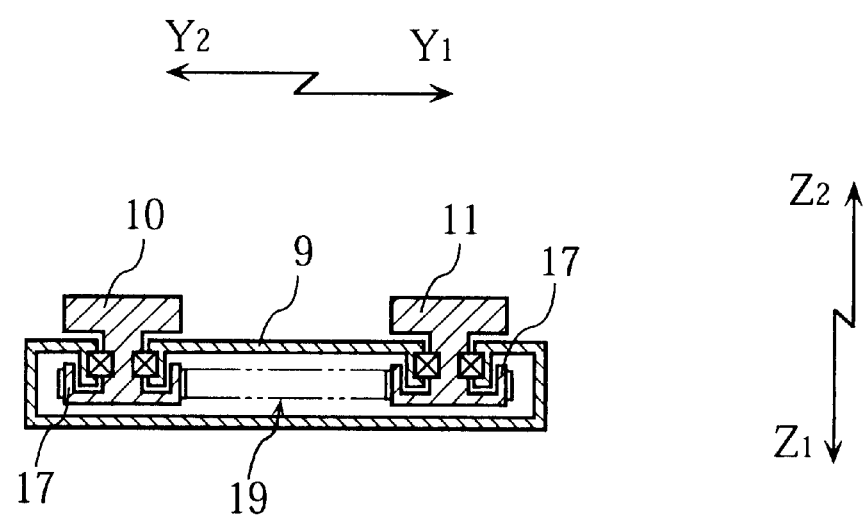
FIG. 6 is a sectional view taken along lines VI—VI in FIG. 4.

Reference is first made to FIGS. 1A–11 which show a transfer robot according to a first embodiment of the present invention. As shown in FIG. 4, the transfer robot of this embodiment includes a stationary base member 1, a first shaft 2 and a second shaft 3. These shafts 2, 3 are supported by the base member 1 via a suitable number of bearings and arranged to coaxially rotate about a first axis O1 which extends vertically. The base member 1 may be installed in a vacuum chamber (not shown). For maintaining the vacuum condition in the vacuum chamber, magnetic fluid seals 4, 5 are fitted on the first and the second shafts 2, 3, respectively.

The illustrated robot also includes a first and a second driving devices 6, 7 for rotating the shafts 2 and 3, respectively. Each of the driving devices 6, 7 is associated with a corresponding one of the shafts 2, 3 via a suitable speed reducer, a rotation-transmitting member such as a sprocket or a pulley, and a connecting member such as a chain or a timing belt. The first and the second driving devices 6, 7 are fixed to the stationary base member 1.

Figure 1A:
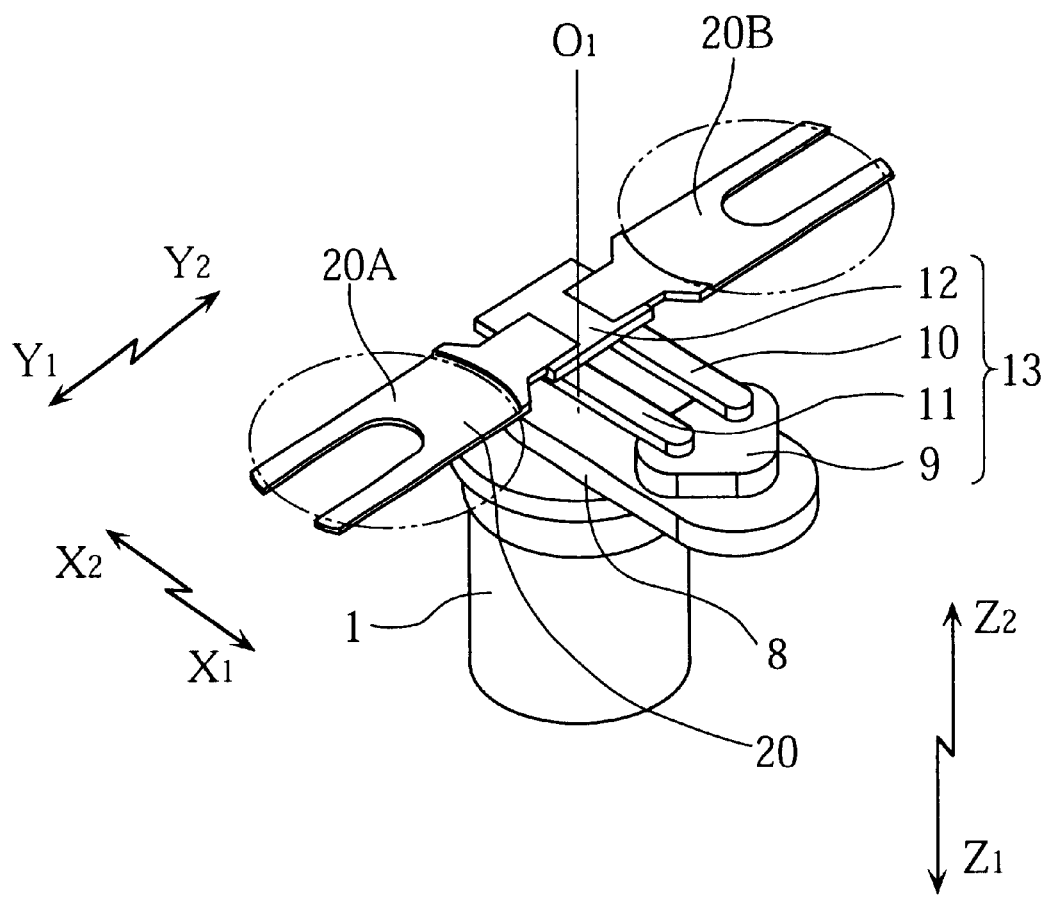
FIGS. 1A and 1B are perspective views showing a transfer robot according to a preferred embodiment of the present invention.

As shown in FIGS. 1A and 4, the transfer robot further includes a base link 8, an outer link 9, a pair of intermediate links 10, 11 and an inner link 12. The base link 8 is secured at an end thereof to the first shaft 2. The outer link 9 is rotatably supported by the base link 8 for performing rotation about a second axis O2 extending parallel to the first axis O1. The intermediate links 10, 11 are rotatably supported, at their one end (called "outer end" below), by the outer link 9 so that they are rotatable about third axes O3 extending parallel to the first axis O1.

Figure 2:
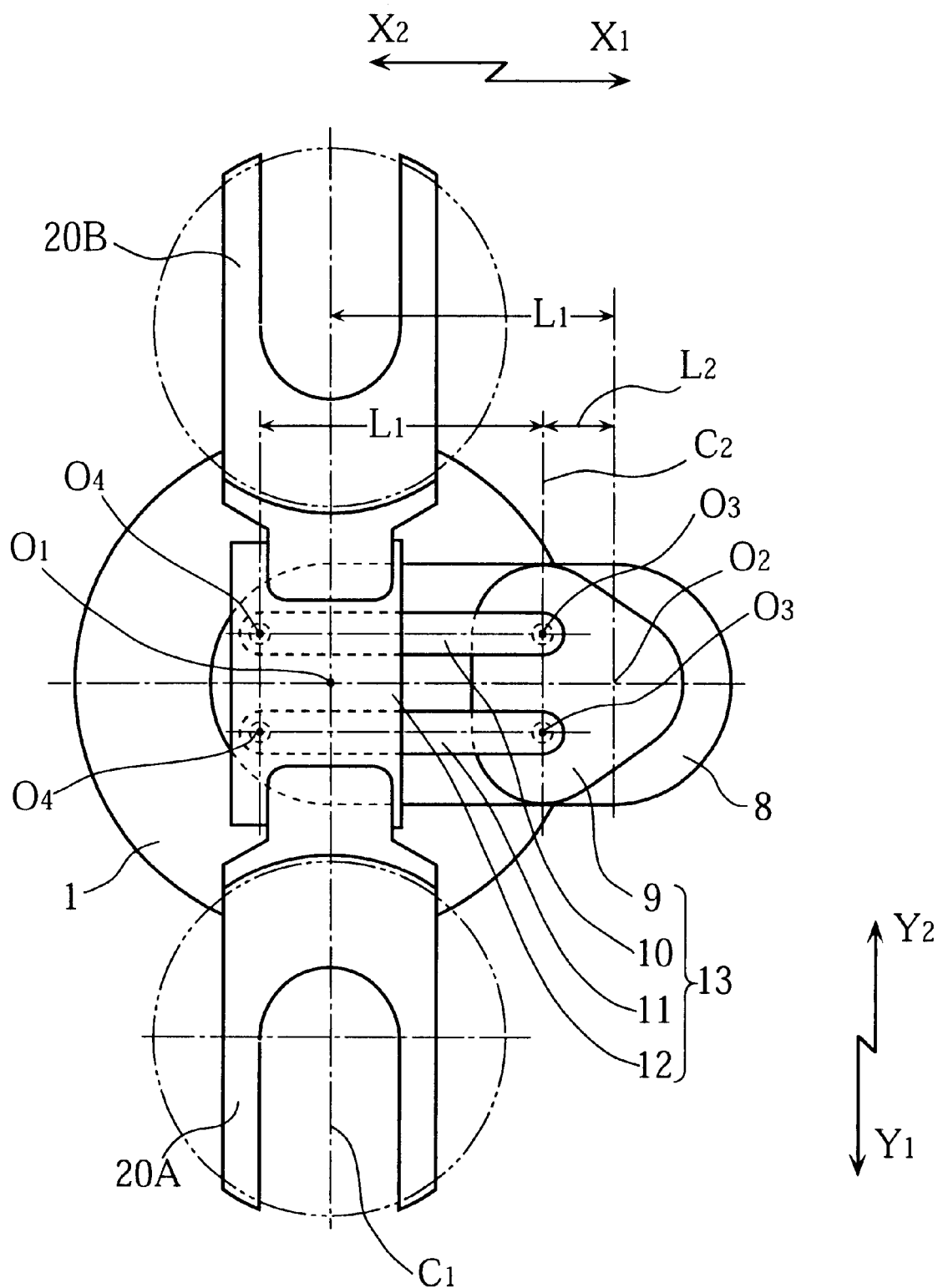
FIG. 2 is a plan view showing the transfer robot of the first embodiment with its arm mechanism held in the initial position.
Figure 3:
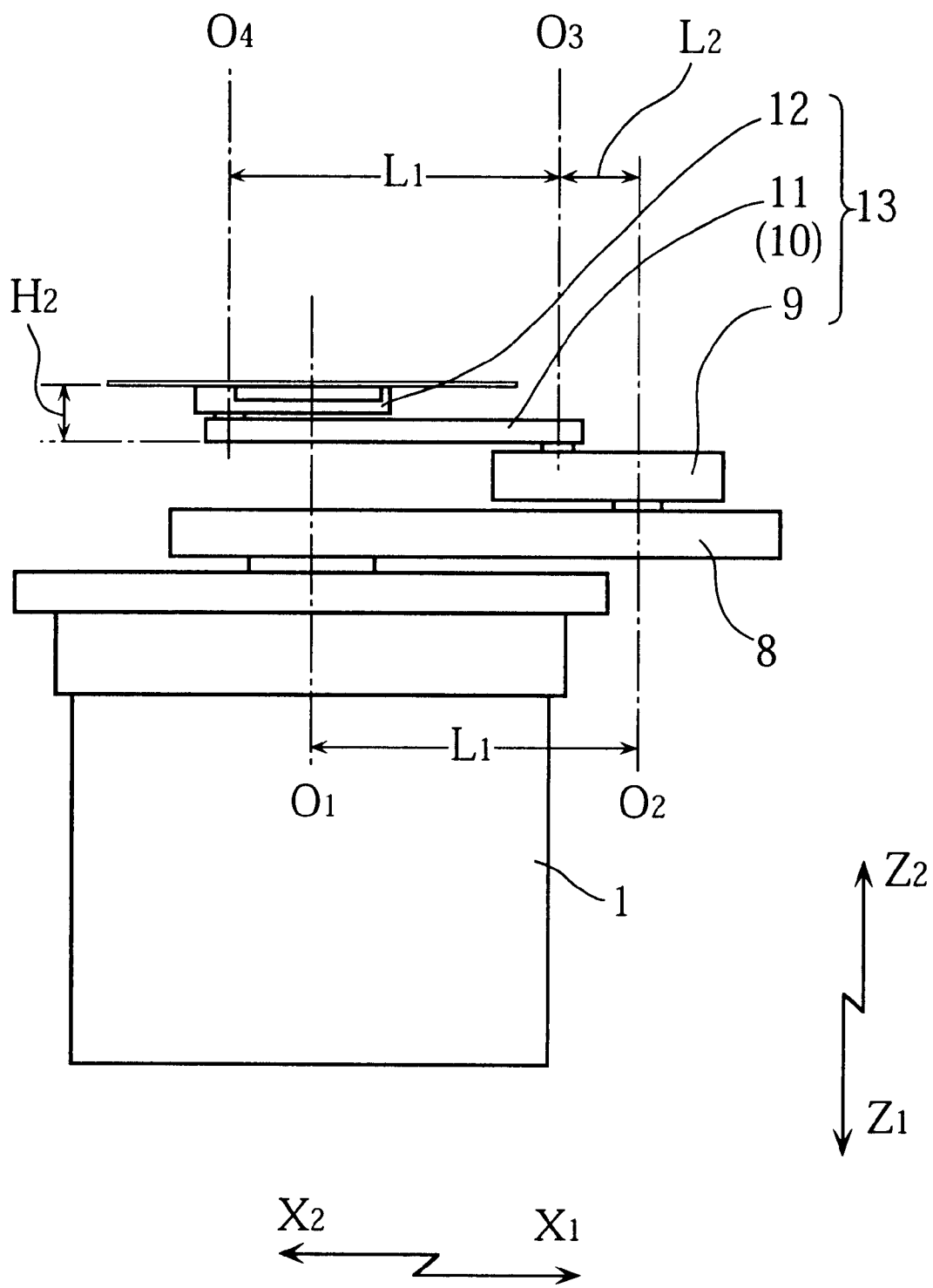
FIG. 3 is a front view showing the transfer robot of the first embodiment.

As best shown in FIG. 2, the third axes O3 are spaced from each other in the Y1-Y2 direction, while also being offset from the second axis O2 toward the first axis O1 (to the left in FIG. 2) by a predetermined distance L2. The inner link 12 is rotatably supported by the intermediate links 10, 11 for performing rotation about fourth axes O4. Each of the fourth axes O4 extends vertically (i.e., parallel to the first axis O1) through an end of the intermediate link 10 or 11. This end of the intermediate link 10 (or 11), which is opposite to the above-mentioned outer end, may be referred to as "inner end" hereinafter.

The inner link 12, the intermediate links 10, 11 and the outer link 9 constitute a pantograph assembly 13. As illustrated in FIG. 2, the distance L1 between the first axis O1 and the second axis O2 is equal to the distance between the third axis O3 and the fourth axis O4.

With the above arrangement, a single-dot chain line C1 (which passes through the first axis O1 and is parallel to another straight line C2 defined by the two third axes O3) extends between the third axes O3 and the fourth axes O4. This fact holds for an instance where the base link 8 has been rotated about the first axis O1 through an angle θ (see FIG. 9B).

The transfer robot of the first embodiment is provided with two handling members 20A, 20B for holding workpieces to be processed. As best shown in FIG. 2, the handling members 20A, 20B are supported by the inner link 12 in a manner such that they project from the inner link 12 in the opposite directions.

Referring to FIG. 4, reference numeral 14 refers to a first rotation transmitting member fixed to the second shaft 3, while reference numeral 15 refers to a second rotation transmitting member fixed to the outer link 9. The axis of the second rotation transmitting member 15 coincides with the second axis O2. A third rotation transmitting member 16, whose axis also coincides with the second axis O2, is secured to the base link 8. A fourth rotation transmitting member 17 is fixed to each of the intermediate links 10, 11 (see also FIG. 5). The axis of the fourth rotation transmitting member 17 coincides with the third axis O3.

The first rotation transmitting member 14 is identical in diameter to the second rotation transmitting member 15. The third rotation transmitting member 16 is identical in diameter to the fourth rotation transmitting member 17.

The first rotation transmitting member 14 is associated with the second rotation transmitting member 15 by a first connection belt 18 provided therebetween. Thus, when the first rotation transmitting member 14 is rotated about the first axis O1, the second rotation transmitting member 15 will be rotated about the second axis O2. Similarly, the third rotation transmitting member 16 is associated with the fourth rotation transmitting members 17 by a second connection belt 19 provided therebetween. Thus, when the third rotation transmitting member 16 is rotated about the first axis O2, the fourth rotation transmitting members 17 will be rotated about the third axes O3.

Description will now be made of the workings of the transfer robot having the above arrangements. It is assumed that the straight line passing through the first and the second axes O1, O2 initially extends in the X1-X2 direction, as shown in FIG. 2.

Figure 7A:
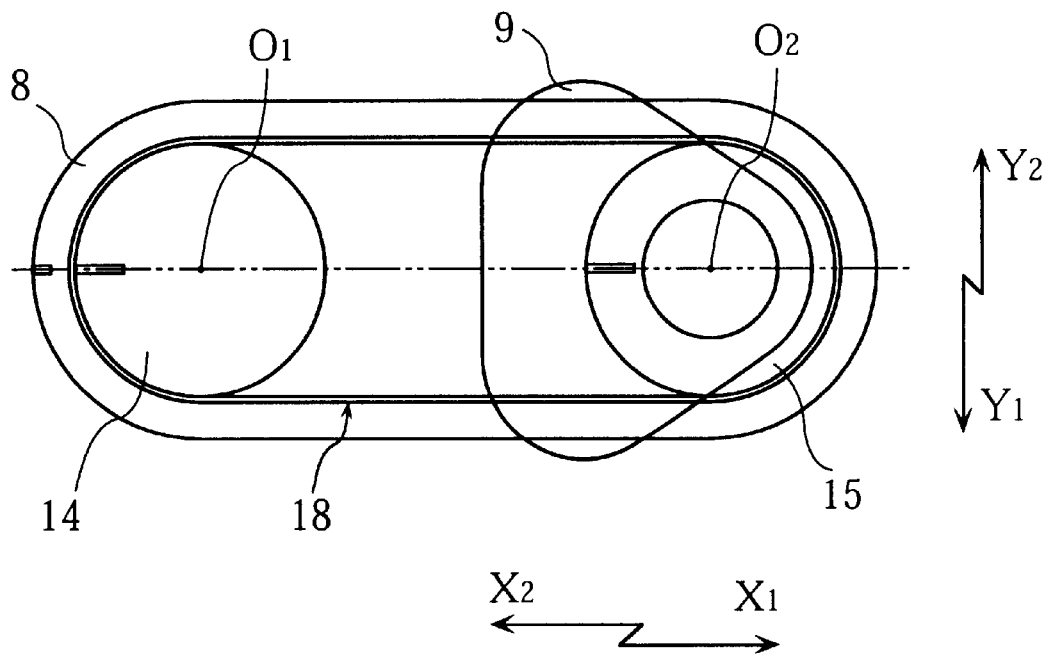
FIGS. 7A and 7B are plan views illustrating the operation of principal parts of the arm mechanism.
Figure 7B:
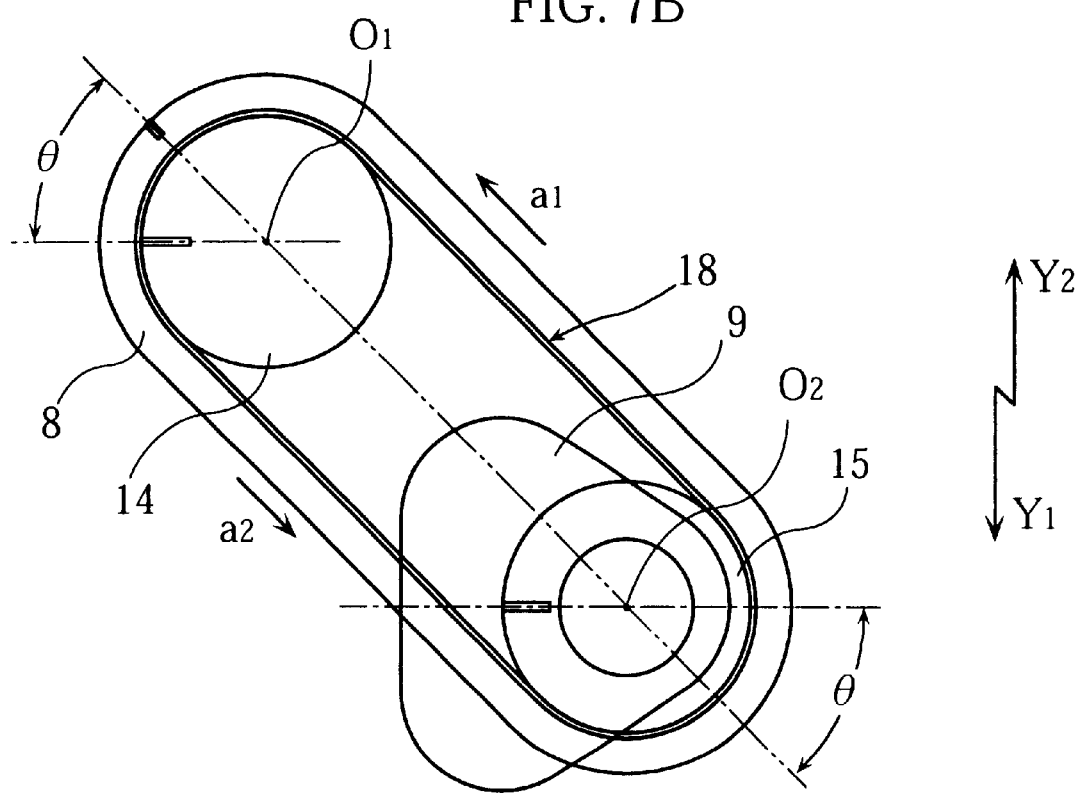

When the first driving device 6 is actuated, the first shaft 2 (and hence the base link 8) is rotated for example clockwise about the first axis O1 through an angle θ, as shown in FIG. 7B. At this time, if the second driving device 7 is not actuated, the first rotation transmitting member 14, which is secured to the second shaft 3, is kept stationary.

Thus, when the base link 8 is rotated through an angle θ from the initial position shown in FIG. 7A to a next position shown in FIG. 7B, the first connection belt 18 is wound or unwound on or from the first rotation transmitting member 14. More specifically, the Y1-side of the connection belt 18 is unwound from the first rotation transmitting member 14, whereas the Y2-side of the belt 18 is wound on the transmitting member 14. Thus, the first connection belt 18 is moved in the a1-and a2-direction, causing the second transmitting member 15 to rotate counterclockwise about the second axis O2 through an angle θ. As a result, the outer link 9, which is fixed to the second rotation transmitting member 15, is caused to shift in the Y1-direction but not to rotate about the second axis O2, as shown in FIGS. 7A and 7B.

Figure 8A:
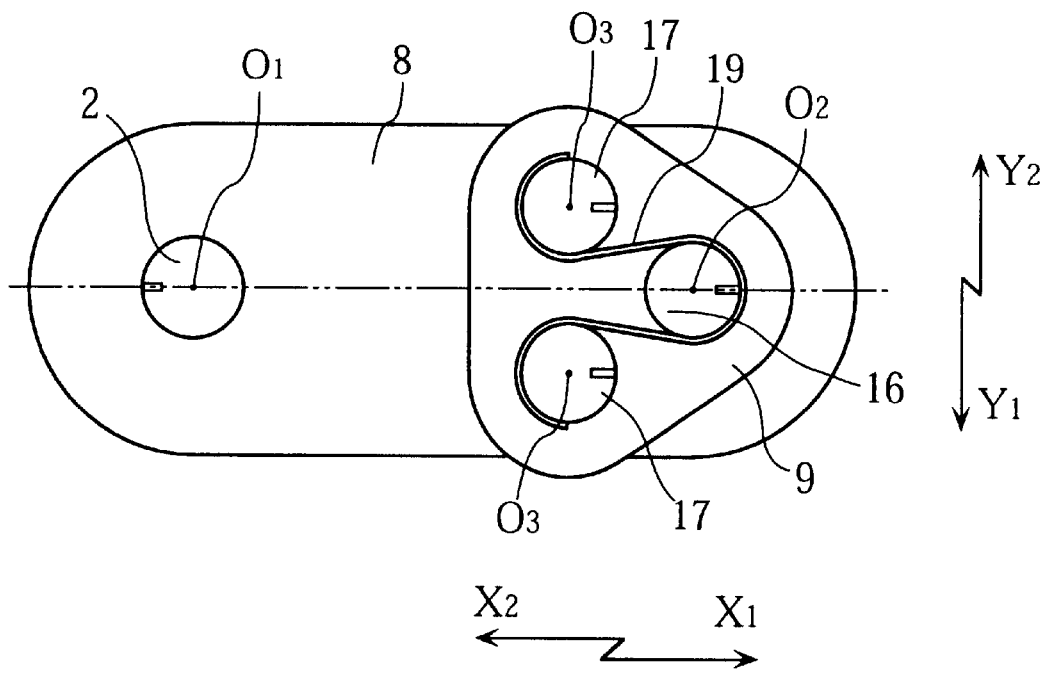
FIGS. 8A and 8B are plan views schematically showing the operation of principal parts of the arm mechanism.
Figure 8B:
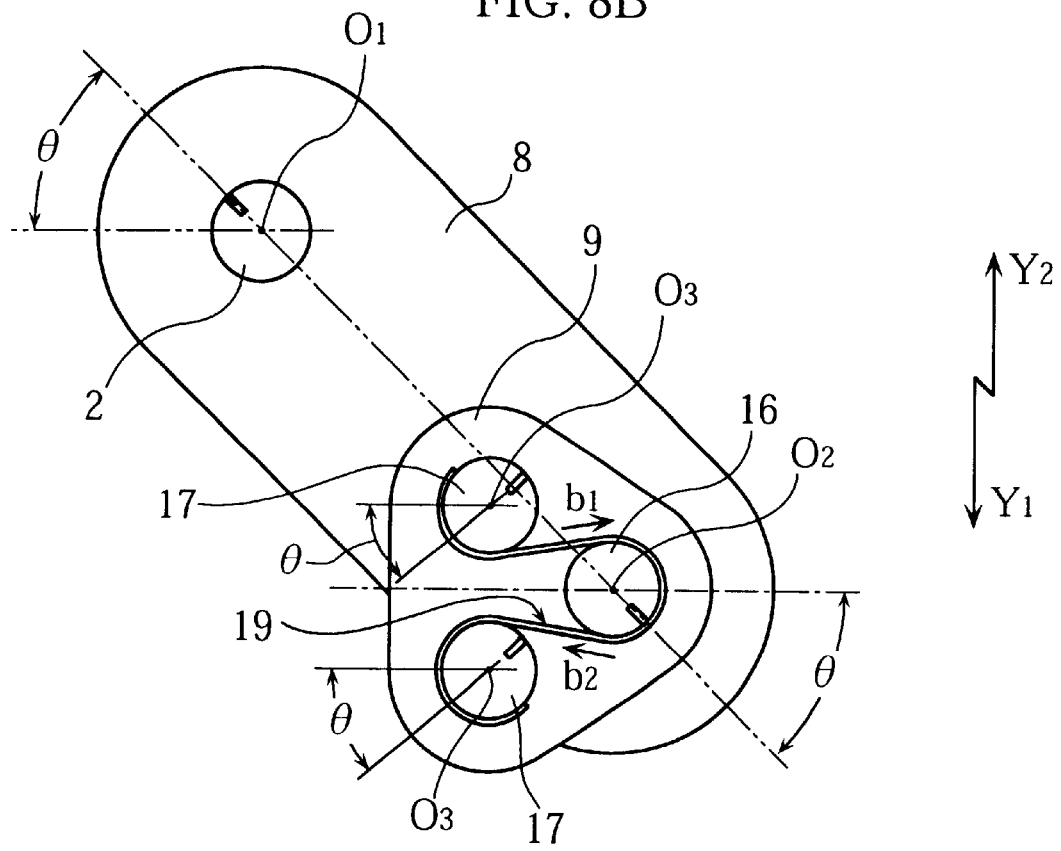

Referring now to FIGS. 8A and 8B, when the base link 8 is rotated clockwise about the first axis O1 through an angle θ, the third rotation transmitting member 16 (which is fixed to the base link 8) is rotated clockwise about the second axis O2 through an angle θ. Correspondingly, the second connection belt 19 is moved in the b1-and b2-direction, thereby causing the fourth rotation transmitting members 17 to rotate counterclockwise about the third axes O3 through an angle θ.

Figure 9A:
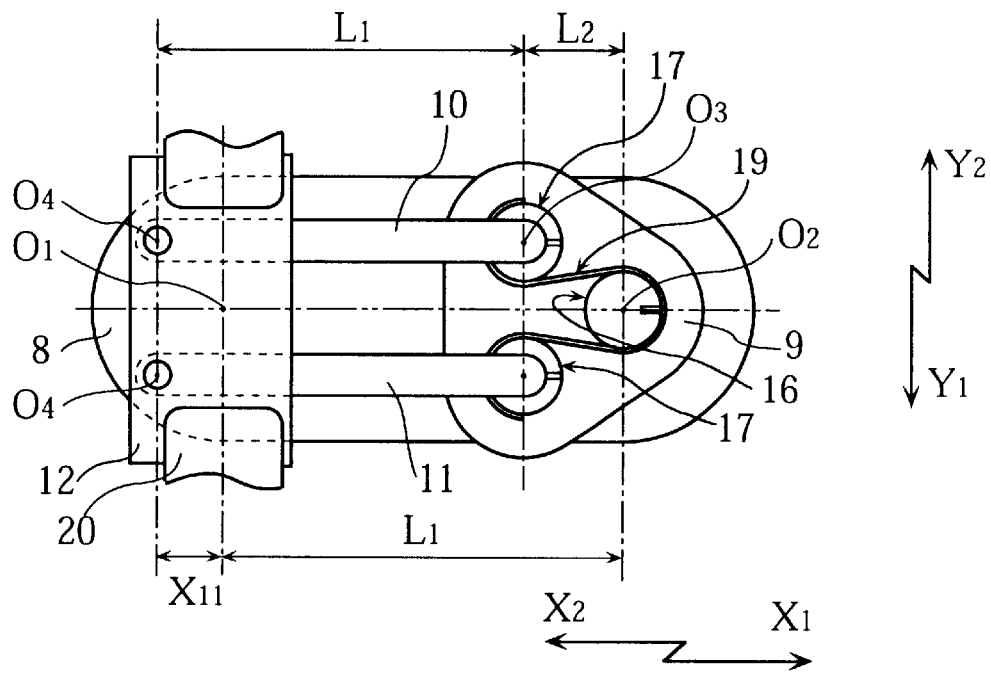
FIGS. 9A and 9B are plan views illustrating the operation of principal parts of the arm mechanism.
Figure 9B:
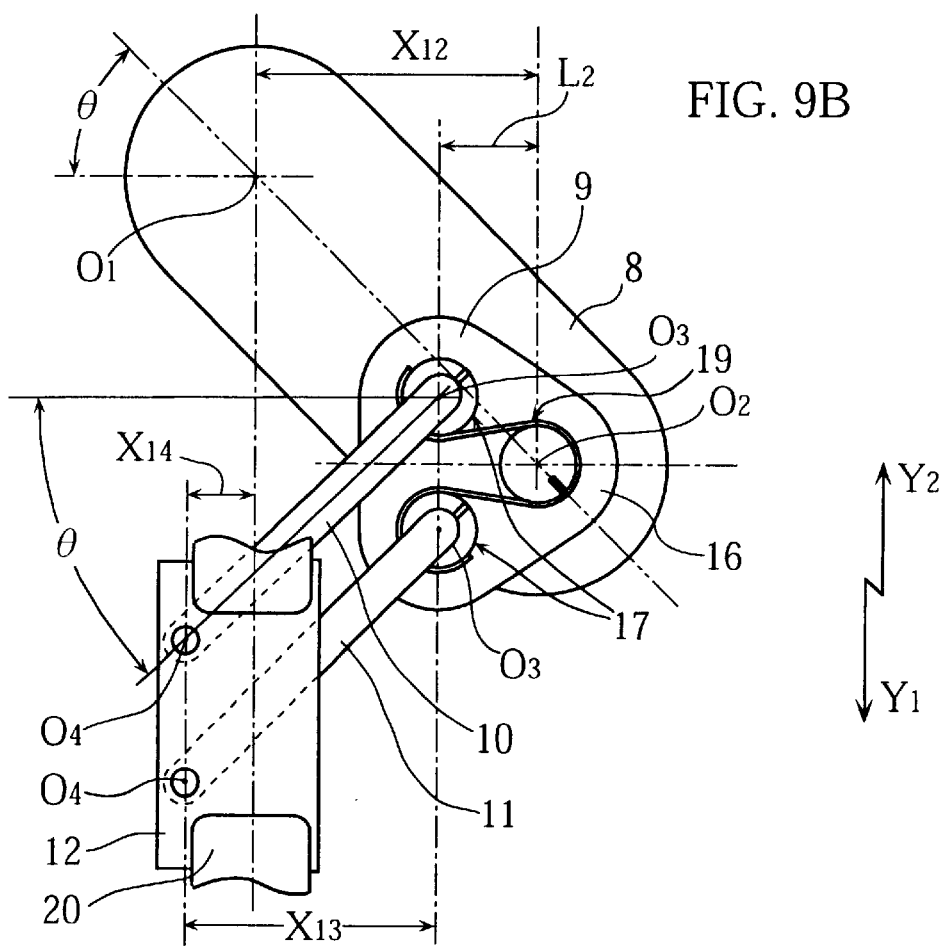

As previously stated, the rotation transmitting members 17 are fixed to the intermediate links 10 and 11, respectively. Thus, when the base link 8 is rotated clockwise about the first axis O1 through the angle θ, the two intermediate links 10, 11 are rotated counterclockwise about the third axes O3 through an angle θ, as shown in FIGS. 9A and 9B. In this manner, the pantograph assembly 13 (made up of the outer link 9, the intermediate links 10, 11 and the inner link 12) is moved from the initial position shown in FIG. 9A to a new position shown in FIG. 9B when the base link 8 is rotated clockwise about the first axis O1 through the angle θ.

In the initial state shown in FIG. 9A, the distance X11 between the first axis O1 and the fourth axes O4 is equal to the distance L2 since the distance between the first and the second axes O1, O2 is equal to the distance between the third and the fourth axes O3, O4.

In the state shown in FIG. 9B, the sign X12 refers to the distance between the first and the second axes O1, O2, as viewed in the X1-X2 direction. Similarly, the sign X13 refers to the distance between the third and the fourth axes O3, O4, while the sign X14 refers to the distance between the first and the fourth axes O1, O4.

In the above instance, the following equations hold:

$X12-L2=X13-X14$, $X12=L1 \times COS\theta$, $X13=L1 \times COS\theta$.

From these, a relation $X14=L2$ is obtained. Further, since L2 is equal to X11, it is known that X14 is equal to X1. This means that the inner link 12 is not displaced in the X1-X2 direction even when the base link 8 is rotated about the first axis O1. In other words, upon rotation of the base link 8, the inner link 12 is moved only in the Y1-Y2 direction. At this time, the initial posture of the inner link 12 is maintained.

As shown in FIG. 9A, the fourth axes O4 of the pantograph assembly 13 are offset to the left from the first axis O1, as viewed in the X1-X2 direction. However, the handling members 20A, 20B are attached to the inner link 12 in a manner such that their longitudinal center lines coincide with a straight line passing through the first axis O1. Thus, when the inner link 12 is moved in the Y1-Y2 direction, a workpiece placed on the handling member 20A or 20B is moved horizontally, with the center of the workpiece kept in a straight line.

Figure 1B:
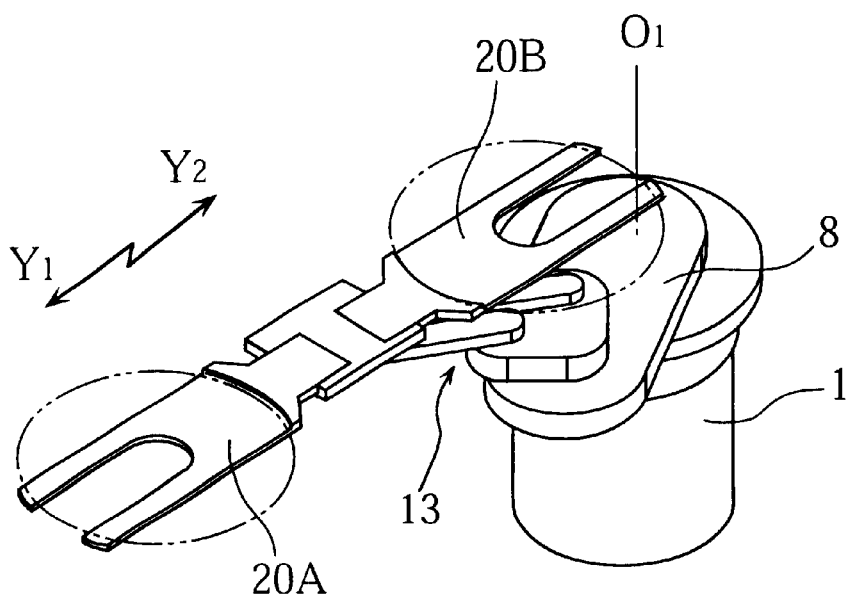

In use, as shown in FIGS. 1A and 1B, the handling member 20A for example is moved in the Y1-direction from the initial position (FIG. 1A) to a working position (FIG. 1B). While the handling member 20A is at the working position, a workpiece is shifted onto or away from the handling member 20A. Then, the arm mechanism of the transfer robot is actuated to bring the handling member 20A back to the initial position (FIG. 1A or 2).

When the handling member 20A (and the other handling member 20B as well) is in the initial position, the first and the second driving devices 6, 7 are actuated in synchronism with each other for rotating the first and the second shafts 2, 3 in the same direction and at the same rate. As a result, all components attached to the first shaft 2 or the second shaft 3 are integrally moved around the first axis O1.

After the first and the second shafts 2, 3 have been rotated together through a predetermined angle, either of the handling members 20A, 20B is moved away from the first axis O1 to a working position as shown in FIG. 1B. In this position again, the shifting of a workpiece may be performed.

Figure 10:
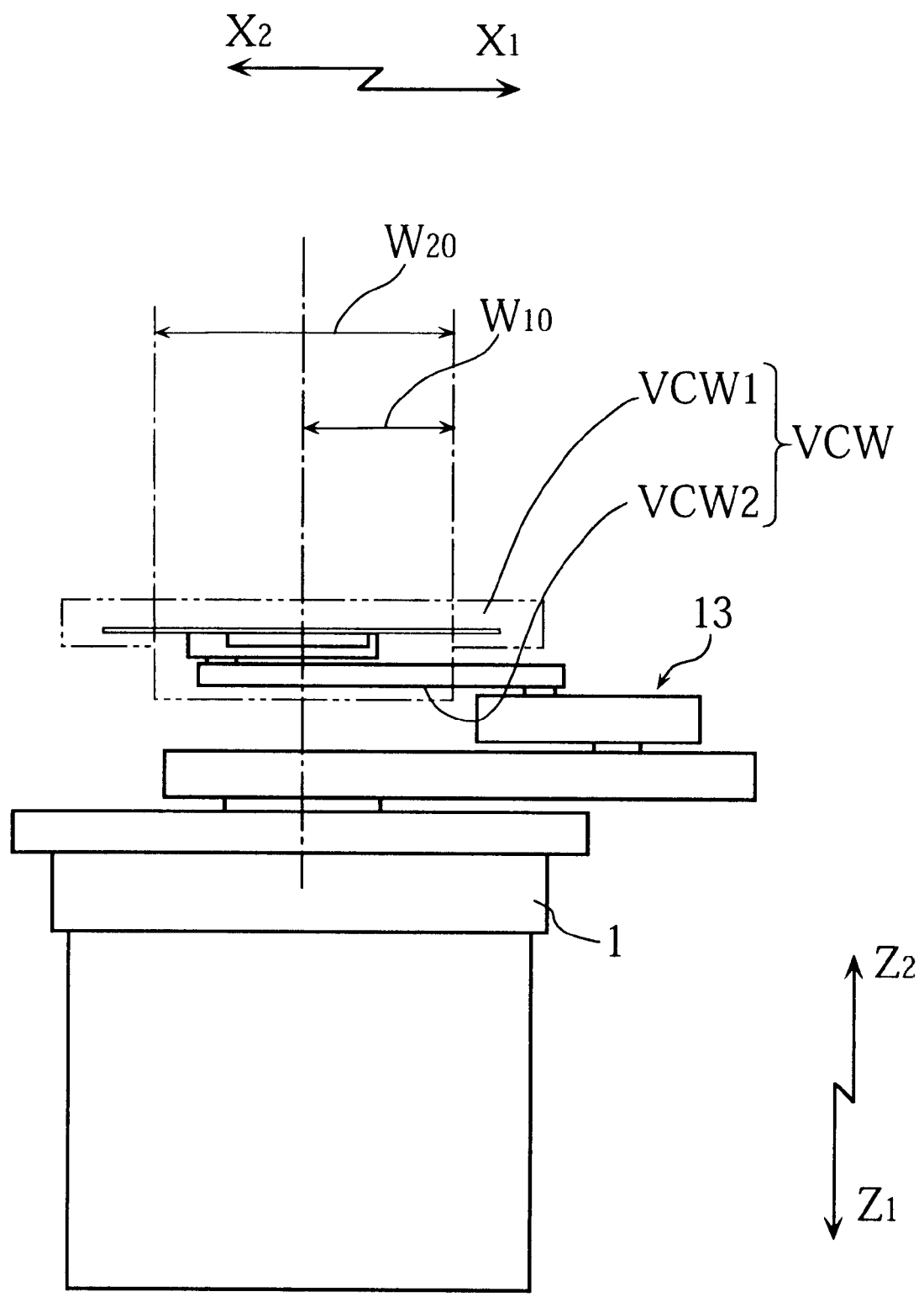
FIG. 10 is a front view showing the transfer robot of the first embodiment together with an opening or window of a processing chamber that is depicted in double-dot chain lines.

Reference is now made to FIG. 10 showing an opening or window VCW (depicted in double-dot chain lines) formed in a processing chamber. The window VCW is provided for allowing passage of a workpiece transferred into or away from the processing chamber.

As illustrated, the window VCW is made up of a wider upper portion VCW1 and a narrower lower portion VCW2. The sign W10 refers to a distance between the first axis O1 and the right end of the lower portion VCW2, as viewed in the X1-X2 direction. The sign W20 refers to the entire width of the lower portion VCW2.

When the handling member 20A is moved in the Y1-direction from the initial position (see FIG. 2), the handling member 20A together with the workpiece is caused to pass through the upper portion VCW1. On the other hand, the inner end of the intermediate link 10 is inserted into the lower portion VCW2, while the inner end of the other intermediate link 11 is inserted into the processing chamber (not shown) through the lower portion VCW2 of the window VCW.

As previously described, the third axes O3 are offset from the second axis O2 toward the first axis O1 (see FIG. 2), thereby causing the fourth axes O4 to be located to the left of the first axis O1. With such an arrangement, even when the distance W10 is relatively small, the intermediate link 11 can be inserted into the non-illustrated processing chamber to a great extent, as shown in FIG. 11, without being interfered with by the right end of the lower portion VCW2 of the window VCW.

Figure 11:
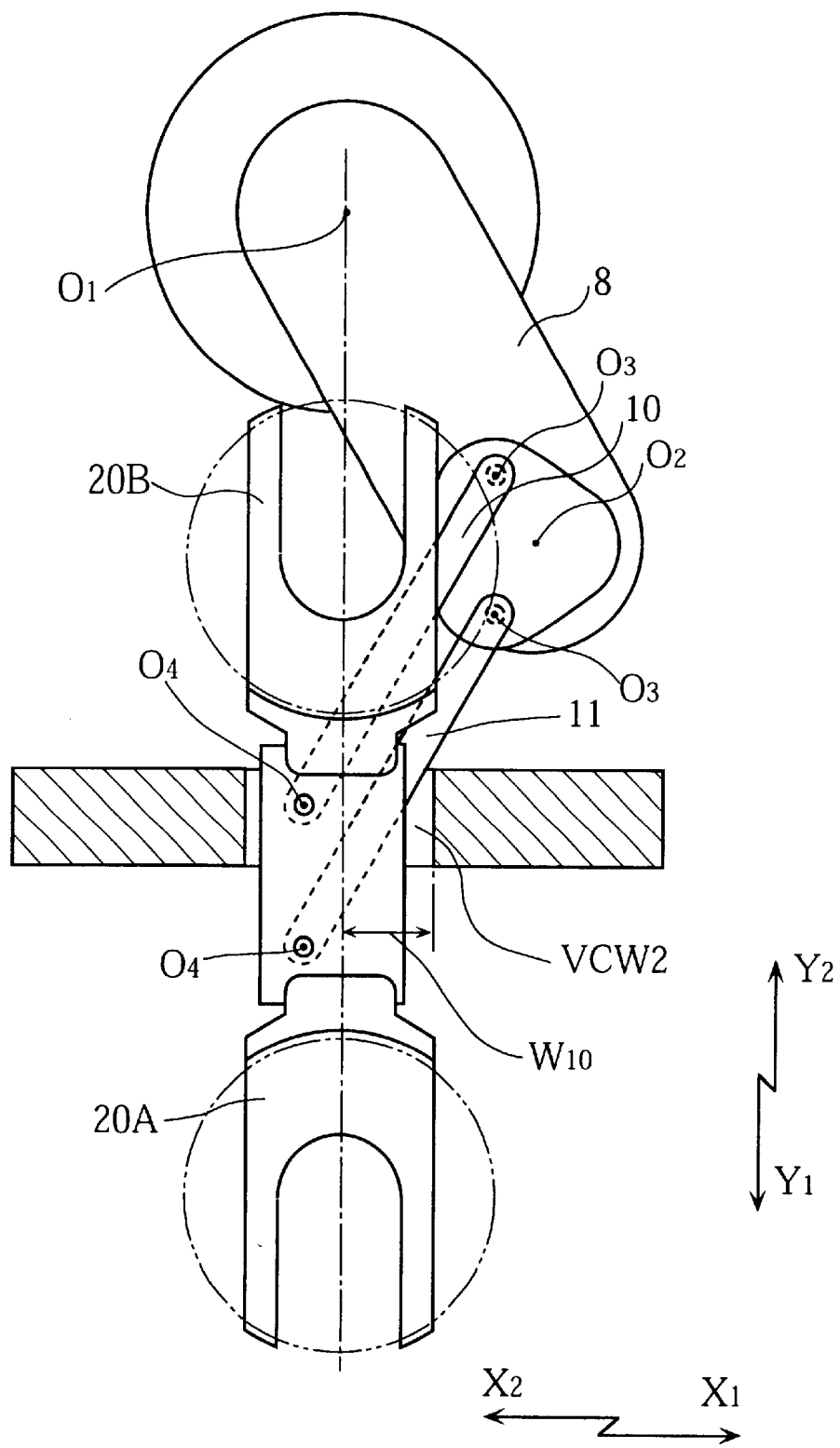
FIG. 11 is a plan view for illustrating the advantages of the transfer robot of the first embodiment.
Figure 12:
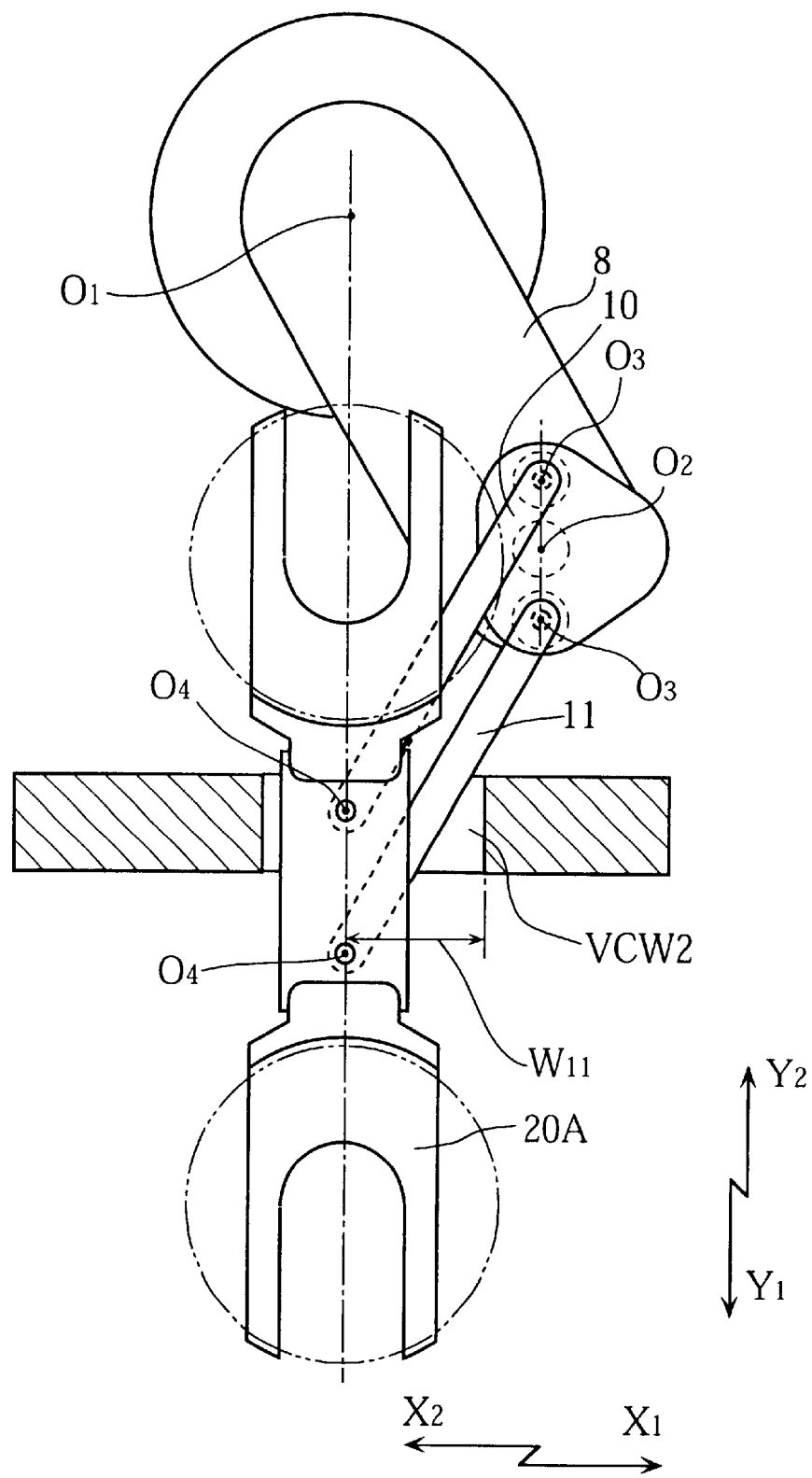
FIG. 12 is a plan view, put for better understanding of FIG. 11, that shows an arrangement of a transfer robot which does not fall in the scope of the present invention.

On the other hand, when the third axes O3 are not offset from the second axis O2 in the X1-X2 direction and therefore the fourth axes O4 are in a line passing through the first axis O1, as shown in FIG. 12, the length W11 needs to be rendered greater than the length W10 in order to insert the handling member 20A into the processing chamber to the same extent as in FIG. 11.

Thus, according to the present invention, the lower portion VCW2 of the window VCW can advantageously be small.

Though not shown in FIG. 11, it is also possible to insert the other handling member 20B into the processing chamber. To this end, starting from the state shown in FIG. 11, first the arm mechanism is rotated about the first axis O1 through 180 degrees after the handling members 20A, 20B are returned to the initial position. Thereafter, the handling member 20B is moved into the processing chamber. In this case, the distance between the left end of the lower portion VCW2 and the single-dot chain line passing through the first axis O1 should be W10, so that the intermediate link 10 will not be interfered with by the left end of the lower portion VCW2.

According to the present invention, the following advantages are also obtained.

Figure 15:
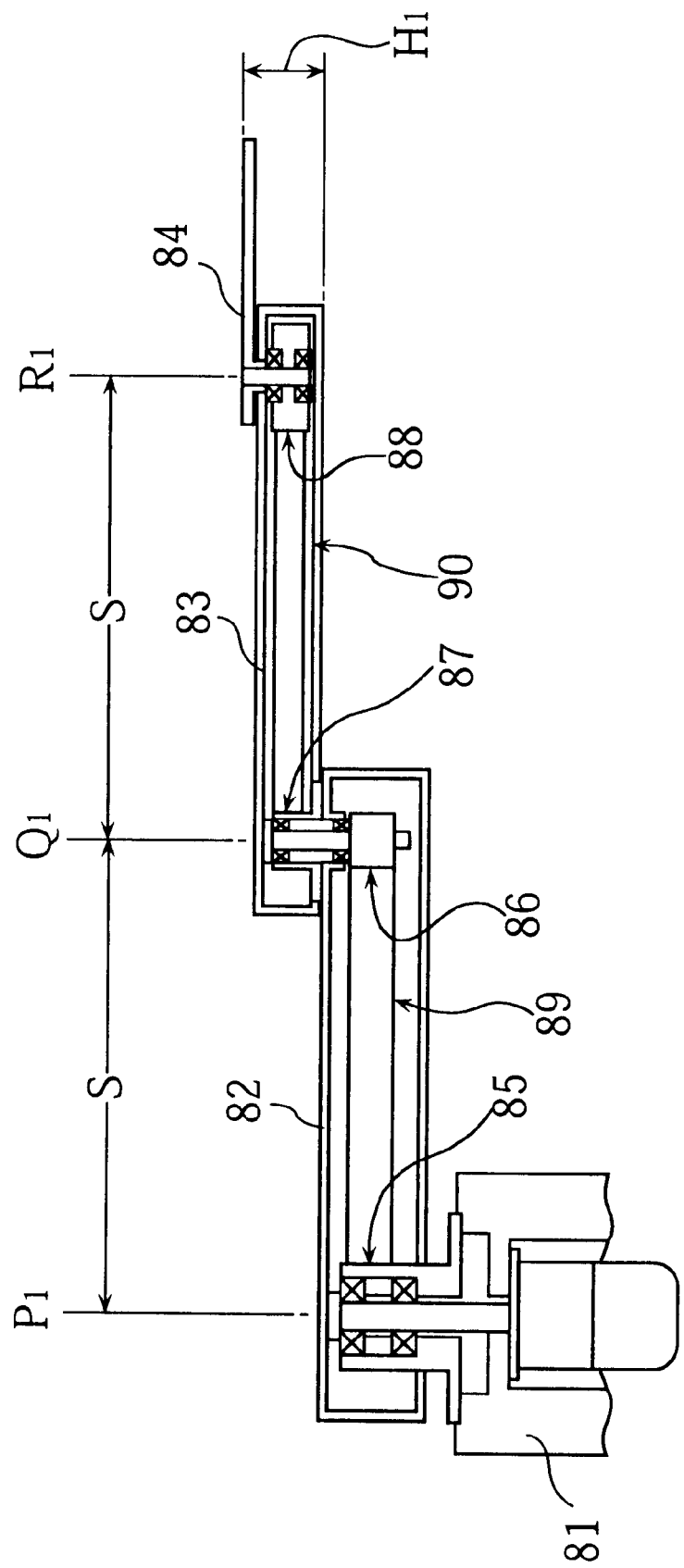
FIG. 15 is a sectional view showing an arm mechanism of a conventional transfer robot.
Figure 16:
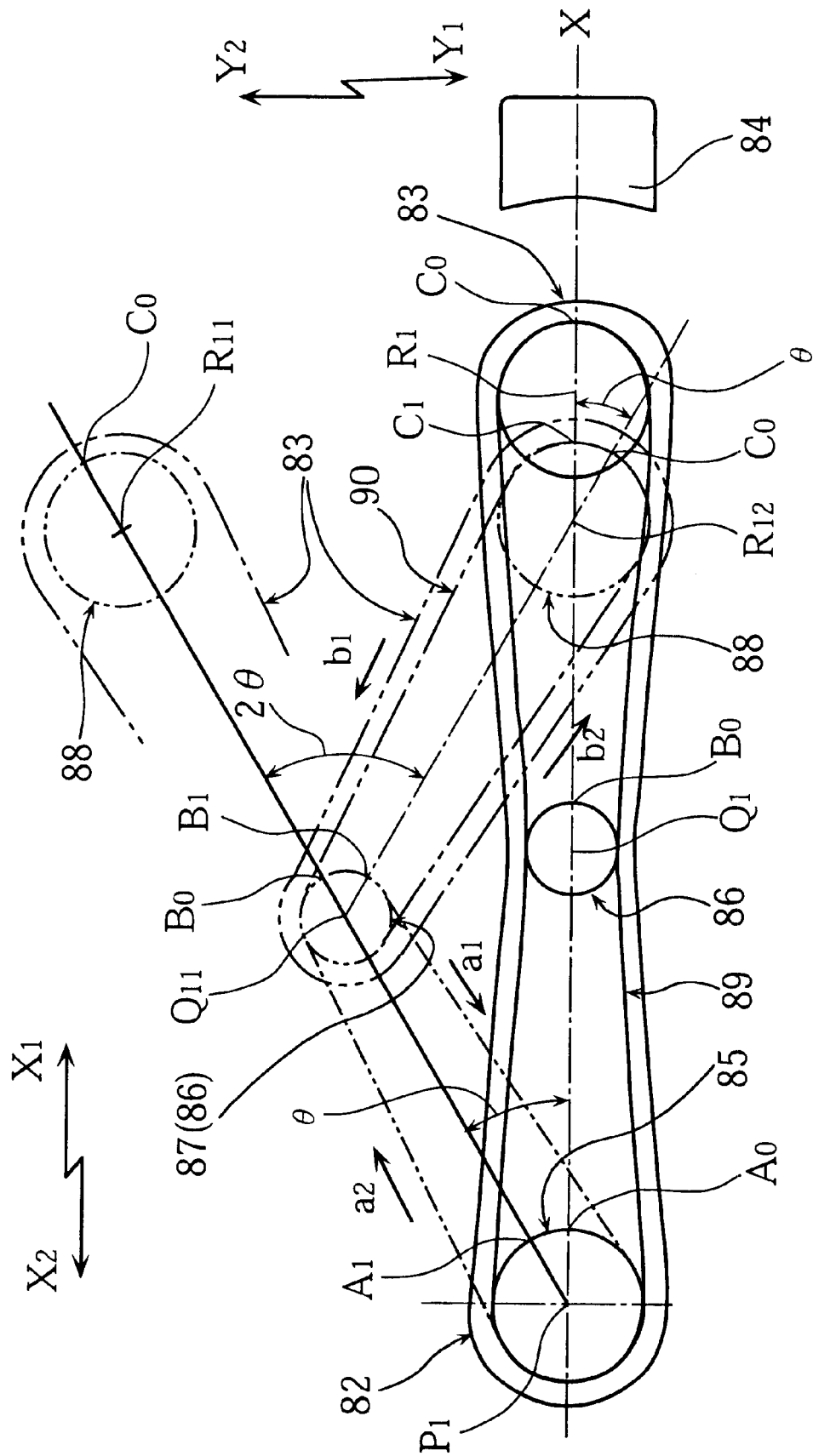
FIG. 16 is a plan view illustrating how the arm mechanism of the conventional transfer robot operates.
Figure 17:
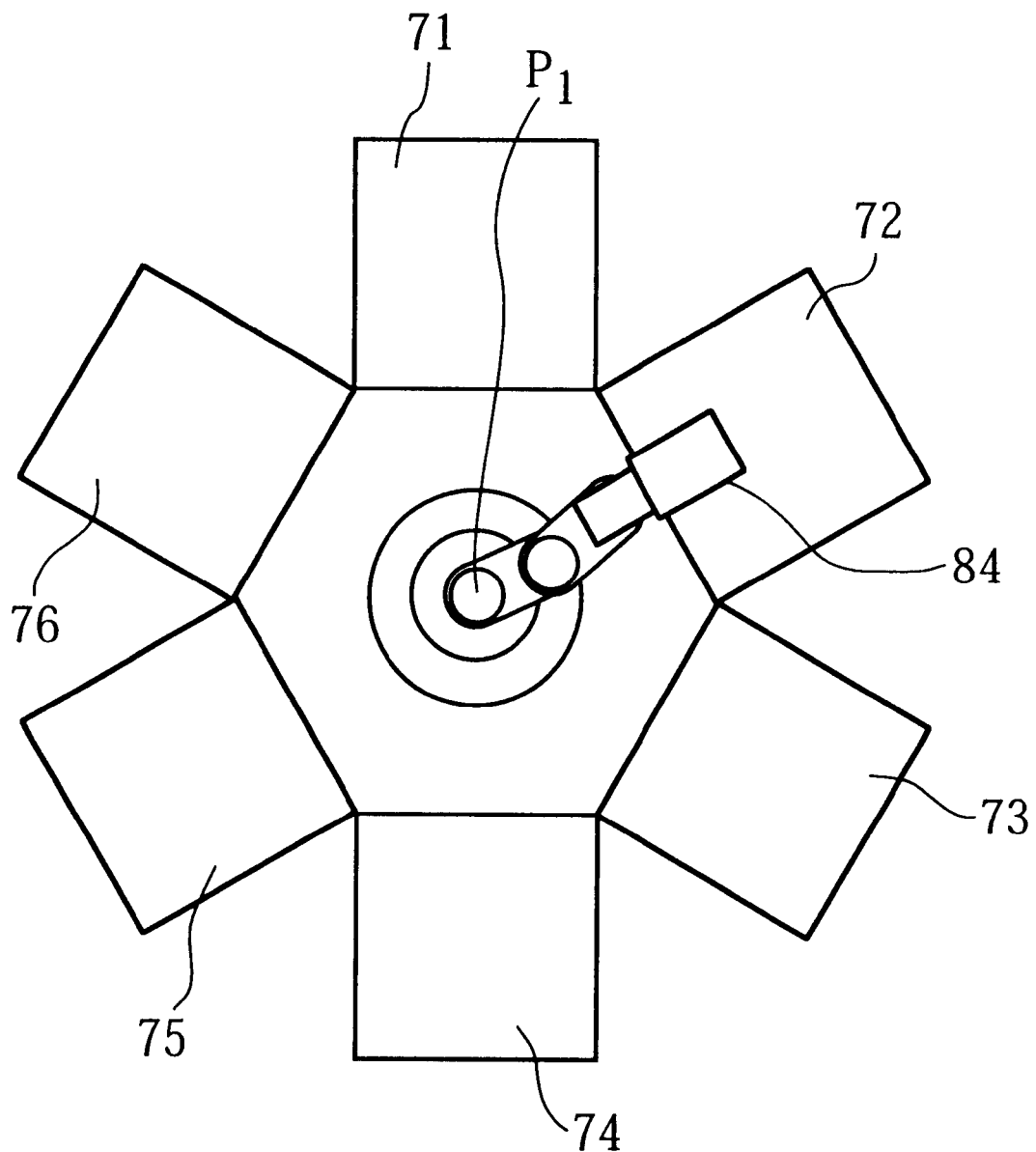
FIG. 17 is a plan view showing the conventional transfer robot around which several processing chambers are provided.

Differing from the conventional transfer robot illustrated in FIGS. 15–17, the transfer robot of the present invention adopts a pantograph mechanism for operating the handling members 20A, 20B. In this manner, it is possible to make the height H2 (see FIG. 3 or 4) smaller than the height H1 of the conventional robot (see FIG. 15) since there is no need to use a rotation transmitting member and a connection belt within the intermediate links 10, 11. When the height H2 is small, the window VCW of the processing chamber can be reduced in height accordingly.

According to the present invention, the area of the window VCW is advantageously minimized by reducing the width and height of the window VCW in the above-described manner. The reduced area of the window VCW serves to facilitate the creation of a desired atmosphere in the processing chamber.

Further, according to the present invention, the first and the second shafts 2, 3 are supported coaxially. Thus, the bearings supporting these shafts and the magnetic fluid seals can be made small in diameter. This means that the transfer robot of the present invention are made compact and inexpensive.

Still further, according to the present invention, the first and the second driving devices 6, 7 are fixed to the stationary base member 1. Thus, the power supply cable for supplying the driving devices with electricity does not break due to the rotation of the arm mechanism. Such an arrangement makes it possible for the handling members 20A, 20B to rotate around the first axis O1 through any desired angle. Thus, the transfer robot of the present invention is more conveniently used than the conventional transfer robot. In addition, the transfer robot of the present invention is made inexpensive since there is no need to use additional devices for monitoring the rotation angle of the handling members.

Figure 13A:
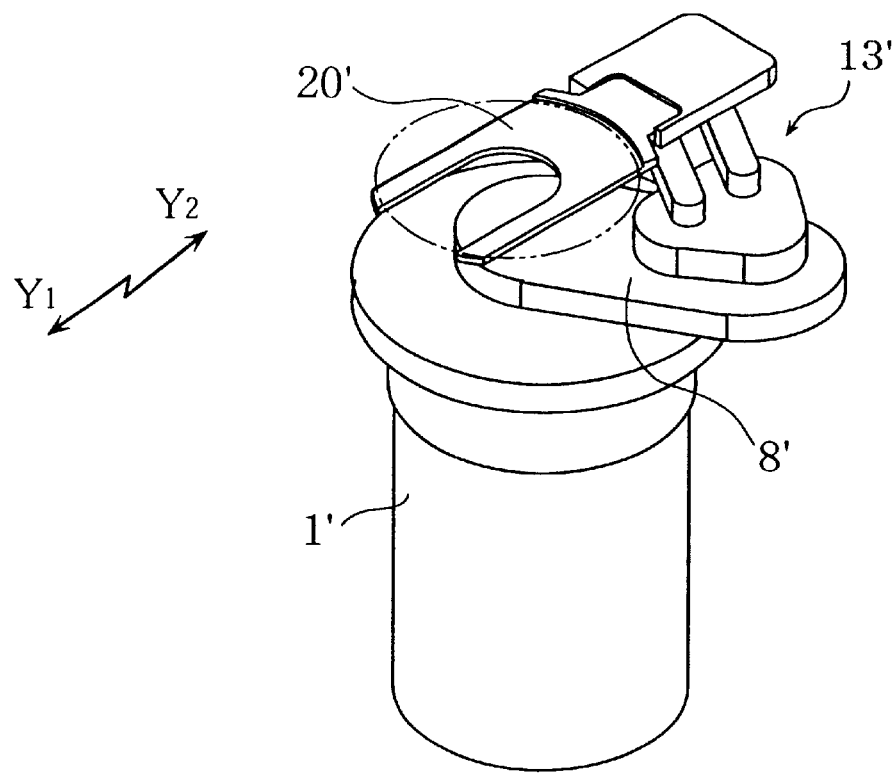
FIGS. 13A and 13B are perspective views showing a transfer robot according to a second embodiment of the present invention.
Figure 13B:
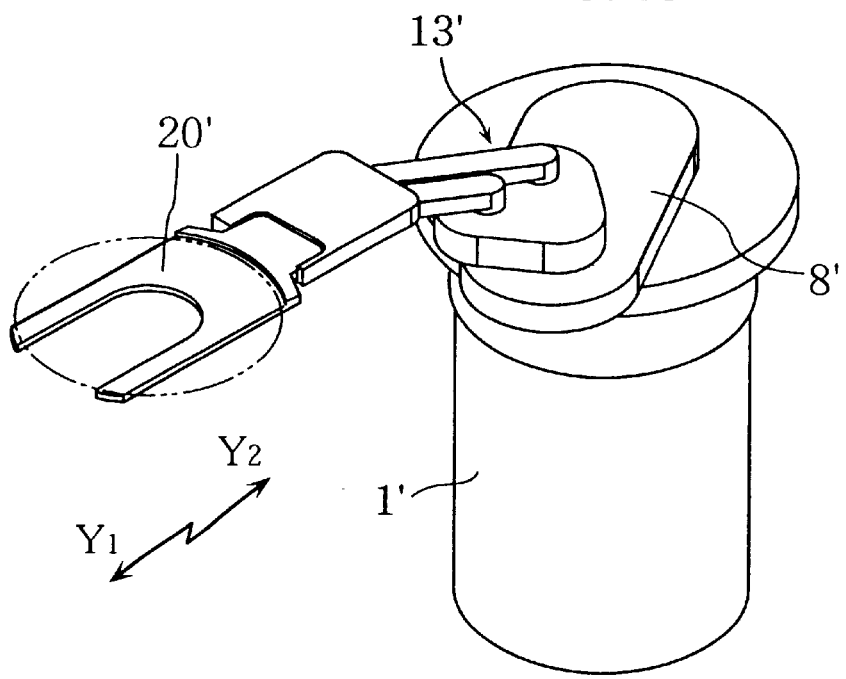
Figure 14:
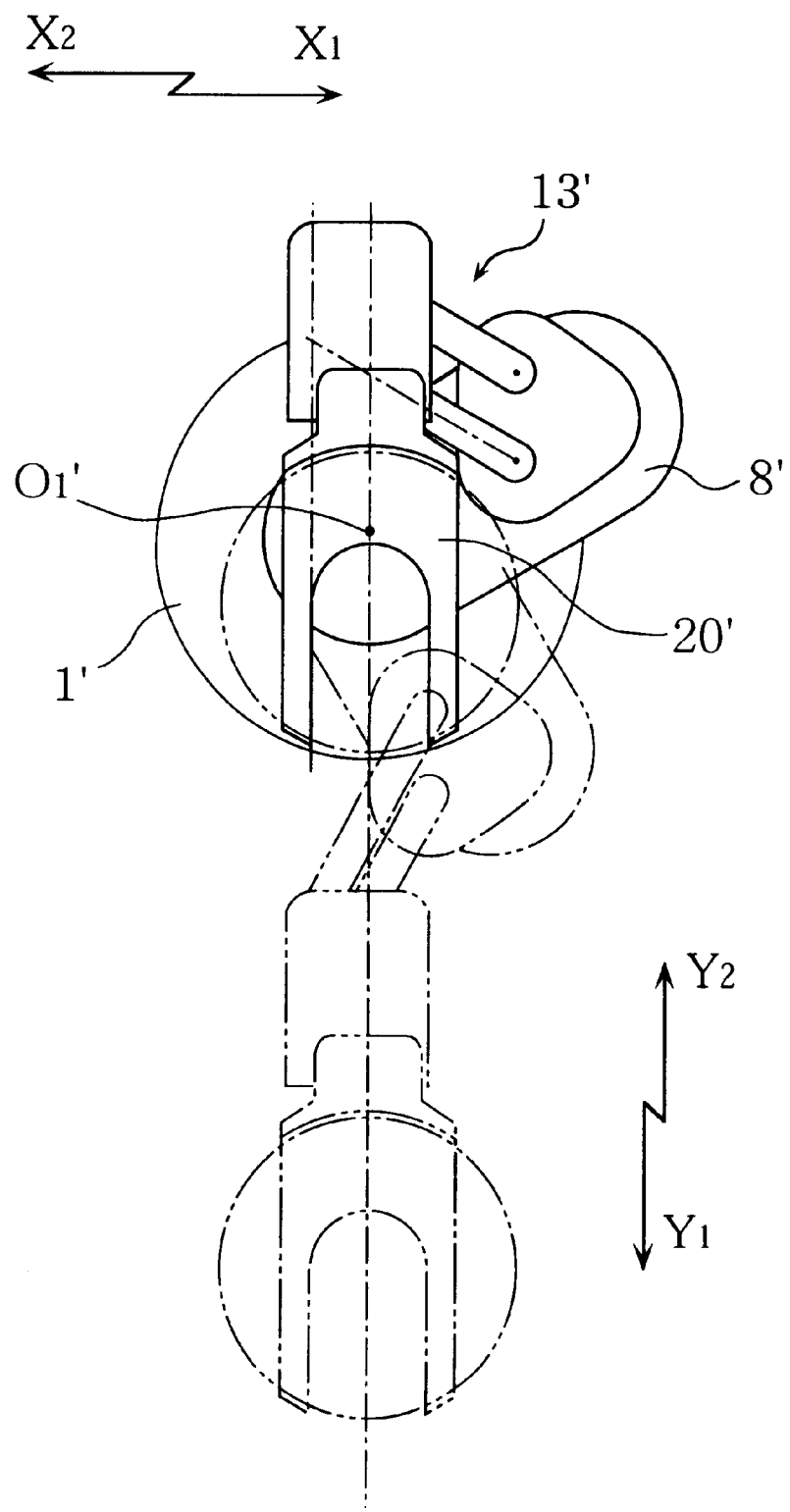
FIG. 14 is a plan view showing an arm mechanism of the transfer robot of the second embodiment, wherein the arm mechanism is brought back to the initial position.

FIGS. 13A–14 show a transfer robot according to a second embodiment of the present invention. The illustrated robot is basically similar in arrangement to the robot of the first embodiment except for the following points.

First, the transfer robot of the second embodiment is provided with a single handling member 20'. With such an arrangement, workpieces may still be transferred efficiently between different processing chambers.

Second, as best shown in FIG. 14, the pantograph assembly 13' together with the handling member 20' is compactly folded above the stationary base member 1' in the initial position (depicted in solid lines). Specifically, the base member 8' is inclined further in the Y2-direction than is shown in FIG. 2. In such an arrangement, there is no need to provide much room or clearance around the arm mechanism in rotating about the first axis O1.

The preferred embodiments of the present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A transfer robot comprising:
a stationary base member;
a first shaft and a second shaft which are rotatable about a common first axis, each of the first and the second shafts being coaxially supported by the base member;
a first driving device and a second driving device associated with the first shaft and the second shaft, respectively, each of the first and the second driving devices being attached to the base member;
a base link fixed to the first shaft;
an outer link supported by the base link for rotation about a second axis;
a pair of intermediate links each supported by the outer link for rotation about a respective third axis which is located closer to the first axis than the second axis;
an inner link supported by each of the intermediate links for rotation about a respective fourth axis;
a first rotation transmitting member fixed to the second shaft;
a second rotation transmitting member fixed to the outer link, the second rotation transmitting member having an axis coinciding with the second axis;
a third rotation transmitting member fixed to the base link, the third rotation transmitting member having an axis coinciding with the second axis;
fourth rotation transmitting members fixed to the intermediate links, respectively, each of the fourth rotation transmitting members having an axis coinciding with a respective one of said third axes;
a first connection member for connecting the first and the second rotation transmitting members to each other;
a second connection member for connecting the third and the fourth rotation transmitting members to each other; and
a first handling member carried by the inner link for supporting a workpiece to be processed;
wherein a distance between the first axis and the second axis is equal to a distance between directly opposite ones of the third and fourth axes pairs.

2. The transfer robot according to claim 1, further comprising a second handling member supported by the inner link, the first handling member and the second handling member being arranged to project from the inner link in opposite directions.

3. The transfer robot according to claim 1, wherein each of the first and the second shafts is rotatably supported via a magnetic fluid seal for hermetic sealing.

4. A transfer robot comprising:

a stationary base member;

a first shaft and a second shaft which are rotatable about a common first axis, each of the first and the second shafts being coaxially supported by the base member;

a first driving device and a second driving device associated with the first shaft and the second shaft, respectively, each of the first and the second driving devices being attached to the base member;

a base link fixed to the first shaft;

an outer link supported by the base link for rotation about a second axis;

a pair of intermediate links each supported by the outer link for rotation about a respective third axis which is located closer to the first axis than the second axis;

an inner link supported by each of the intermediate links for rotation about a respective fourth axis;

a first rotation transmitting member fixed to the second shaft;

a second rotation transmitting member fixed to the outer link, the second rotation transmitting member having an axis coinciding with the second axis;

a third rotation transmitting member fixed to the base link, the third rotation transmitting member having an axis coinciding with the second axis;

fourth rotation transmitting members fixed to the intermediate links, respectively, each of the fourth rotation transmitting members having an axis coinciding with a respective one of said third axes;

a first connection member for connecting the first and the second rotation transmitting members to each other;

a second connection member for connecting the third and the fourth rotation transmitting members to each other; and a first handling member carried by the inner link for supporting a workpiece to be processed;

wherein the fourth axes are arranged such that a first straight line which passes through the first axis and is parallel to a second straight line is defined by the third axes extends between said second straight line and a third straight line defined by the fourth axes.

5. The transfer robot according to claim 4, wherein a distance between the first axis and the second axis is equal to a distance between directly opposite ones of the third and fourth axis pairs.

* * * * *